US007157298B2

(12) United States Patent
Nakayama et al.

(10) Patent No.: US 7,157,298 B2
(45) Date of Patent: Jan. 2, 2007

(54) SURFACE EMITTING SEMICONDUCTOR LASER, AND METHOD AND APPARATUS FOR FABRICATING THE SAME

(75) Inventors: Hideo Nakayama, Kanagawa (JP); Akira Sakamoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 307 days.

(21) Appl. No.: 10/384,675

(22) Filed: Mar. 11, 2003

(65) Prior Publication Data

US 2004/0008747 A1   Jan. 15, 2004

(30) Foreign Application Priority Data

Jul. 10, 2002   (JP)  ............................. 2002-201594

(51) Int. Cl.
*H01L 21/00* (2006.01)
(52) U.S. Cl. .......................................... 438/46; 438/39
(58) Field of Classification Search ................. 372/43, 372/46.013; 438/39, 46, 47
See application file for complete search history.

(56) References Cited

U.S. PATENT DOCUMENTS

| 5,696,023 | A  | * | 12/1997 | Holonyak et al. ........... 438/767 |
| 6,693,707 | B1 | * | 2/2004  | Kaneko ...................... 356/237.1 |
| 7,078,257 | B1 | * | 7/2006  | Sakamoto et al. ............. 438/46 |
| 7,079,561 | B1 | * | 7/2006  | Sakamoto et al. ......... 372/46.013 |
| 7,079,562 | B1 | * | 7/2006  | Sakamoto et al. ......... 372/46.013 |
| 2004/0042519 | A1 | * | 3/2004 | Sakamoto et al. ............. 372/46 |

FOREIGN PATENT DOCUMENTS

| JP | 7-201804    | 8/1995  |
| JP | 10-335383   | 12/1998 |
| JP | 2000-124549 | 4/2000  |
| JP | 2001-102691 | 4/2001  |
| JP | A 2001-93897| 4/2001  |
| JP | 2001-144375 | 5/2001  |

OTHER PUBLICATIONS

Koley et al., "Kinetics of growth of AIAs oxide in selectively oxidized vertical cavity surface emitting lasers", American Institute of Physics, J. Appl. Phys., vol. 82, No. 9, pp. 4586-4589, 1997.

* cited by examiner

*Primary Examiner*—James Menefee
(74) *Attorney, Agent, or Firm*—Oliff & Berridge, PLC

(57) ABSTRACT

A method of fabricating a surface emitting semiconductor laser includes the following steps. A first laminate of semiconductor layers and a second laminate of semiconductor layers are formed on a substrate. The first laminate includes a first reflection mirror layer of a first conduction type, an active region, a III-V semiconductor layer containing Al, and a second reflection mirror layer of a second conduction type, the second laminate being used for monitoring and having an oxidizable region. The first and second laminates are etched so as to form mesas on the substrate in which side surface of the III-V semiconductor layer contained in the first laminate is exposed. Oxidization of the III-V semiconductor layer from the side surface is started at an oxidization rate. During oxidization, a reflectance of the second laminate for monitoring or its variation is monitored, and oxidization of the III-V semiconductor layer is terminated after a constant time from a time when the reflectance or its variation reaches a corresponding given value.

19 Claims, 6 Drawing Sheets

— THEORETICAL VALUE
● EXPERIMENTAL VALUE

SURFACE EMITTING SEMICONDUCTOR LASER, AND METHOD AND APPARATUS FOR FABRICATING THE SAME

BACKGROUND OF THE INVENTION

1. Field of the Invention

The present invention relates to a surface emitting semiconductor laser used as a source for optical information processing, optical communications, optical recording and image forming. The present invention also relates to a method and apparatus for fabricating such a surface emitting semiconductor laser. More particularly, the present invention relates to a technique of accurately defining an aperture surrounded by a selectively oxidized portion of a current confinement region.

2. Description of the Related Art

Recently, there has been an increased demand for a surface emitting semiconductor laser capable of easily realizing an array of sources in the technical fields of optical communications and optical interconnections. Such a laser is also called vertical-cavity surface-emitting laser diode (VCSEL).

The surface emitting semiconductor laser is categorized into a proton injection type with a gain waveguide structure, and a selective oxidization type with a refractive ratio waveguide structure. Nowadays, the latter is getting the mainstream. Generally, the selective oxidization type semiconductor laser has a laser portion of a mesa structure. A current narrowing or confining region formed by selectively oxidizing part of an AlAs layer or AlGaAs layer is formed in the vicinity of the active region of the mesa. The current confinement layer increases the resistivity and reduces the refractive index. This results in an optical waveguide path.

The degree of dimensional accuracy of the non-oxidized region surrounded by an aperture of the current confinement layer and defined by the selectively oxidized region is a very important factor that determines the device performance. The threshold current of laser and the transverse oscillation mode greatly depend on the diameter of the aperture.

Generally, the aperture of the current confinement region is formed by a wet oxidization method. This method employs a carrier gas of nitrogen, and transports a pure water vapor heated up to approximately 100° C. to a chamber. The AlAs or AlGaAs layer having the side surface exposed is oxidized therefrom.

However, it is very difficult to reproducibly control the distance of oxidation that advances from the side surface of the mesa on the process basis and to form the aperture of the current confinement layer as designed. This is because the mesa may have precision error caused by etching, and the oxidization rate depends on the temperature of the water vapor, the amount of gas transported, and the thickness of a naturally oxidized film on the side surface of the AlAs or AlGaAs layer.

A proposal to solve the above problems is described in Japanese Unexamined Patent Publication No. 2001-93897. The proposal describes the use of a sample for monitoring and tracks the degree of advance of oxidization reaction on the wafer or substrate, with which degree the oxidization reaction of the current confinement layer is controlled. The monitor-use sample and the current confinement layer on the wafer or substrate are put in an oxidizing chamber and are subject to simultaneous oxidizing. The oxidization reaction on the current confinement region is controlled by monitoring a reflected light that is varied due to change of the oxidized region of the monitor-use sample.

However, the proposal heats the temperature in the oxidizing chamber to 400° C. for oxidization for forming the current confinement layer. Thus, the AlAs or AlGaAs layer is oxidized at a comparatively high rate of oxidization. Even when the oxidization reaction is terminated by monitoring the reflected light from the monitor-use sample, oxidization of the AlAs or AlGaAs layer from the side surface of the mesa may advance to some extent, so that the aperture of the current confinement layer (diameter of the aperture) cannot fall within the design range. Further, the production yield will be degraded if the aperture defined by the current confinement layer is not reproduced accurately on the process basis. This drives up the cost of producing the surface emitting semiconductor laser devices.

SUMMARY OF THE INVENTION

The present invention has been made in view of the above circumstances and provides a surface emitting semiconductor laser and a method and apparatus for fabricating the same.

According to an aspect of the present invention, a method of fabricating a surface emitting semiconductor laser has the steps of: forming a first laminate of semiconductor layers and a second laminate of semiconductor layers on a substrate, the first laminate including a first reflection mirror layer of a first conduction type, an active region, a III-V semiconductor layer containing Al, and a second reflection mirror layer of a second conduction type, the second laminate being used for monitoring and having an oxidizable region; etching the first and second laminates so as to form mesas on the substrate in which side surface of the III-V semiconductor layer contained in the first laminate is exposed; starting oxidization of the III-V semiconductor layer from the side surface at an oxidization rate; and monitoring a reflectance of the second laminate for monitoring or its variation and terminating oxidization of the III-V semiconductor layer after a constant time from a time when the reflectance or its variation reaches a corresponding given value.

According to another aspect of the present invention, a method of fabricating a surface emitting semiconductor laser has the steps of: forming first and second mesas respectively including III-V semiconductor layers containing Al, side surfaces of the III-V semiconductor layers being exposed; optically monitoring an oxidized condition of the III-V semiconductor layer of the first mesa while the first and second mesas are exposed to an oxidization ambient set at a temperature lower than a predetermined temperature; and forming a current confinement region by controlling the oxidized region of the III-V semiconductor layer of the second mesa on the basis of results of optical monitoring.

According to yet another aspect of the present invention, a method of fabricating a surface emitting semiconductor laser has the steps of: forming a laminate of a first reflection mirror layer of a first conduction type, an active region thereon, a III-V semiconductor layer containing Al, and a second reflection mirror of a second conduction time on the active region; etching predetermined layers that forms the laminate so that a side surface of the III-V semiconductor layer can be exposed; oxidizing the III-V semiconductor layer at a temperature equal to or lower than 375° C.; monitoring reflectance of the III-V semiconductor layer or its variation; and terminating oxidization of the III-V semiconductor layer when a given constant time elapses after the reflection or its variation reaches a corresponding given value.

According to a further aspect of the present invention, an apparatus for fabricating a surface emitting semiconductor laser having a current confinement region obtained by selectively oxidizing part of a III-V semiconductor layer containing Al, has: a projection part that projects light onto at least the III-V semiconductor layer for oxidization; a photoelectric conversion part that converts reflected light from the III-V semiconductor layer into an electrical signal; an operation part that detects an oxidized condition on the III-V semiconductor layer on the basis of the electrical signal and outputs a signal when advance of oxidization goes beyond a given oxidized region; and an oxidization control part that terminates oxidization of the III-V semiconductor layer when a given constant time elapses after receiving the signal output by the operation part.

According to a still further aspect of the present invention, a surface emitting semiconductor laser has: a substrate; and a laminate on the substrate, the laminate including a first reflection layer of a first conduction type, an active region on the first reflection layer, a current confinement layer including an oxidized region, and a second reflection layer on the current confinement layer, a mesa including a range from the second reflection layer to the current confinement layer, the oxidized region of the current confinement layer extending inwards from a side surface of the mesa, and has been oxidized at a temperature equal to or lower than 375° C.

BRIEF DESCRIPTION OF THE DRAWINGS

Preferred embodiments of the present invention will be described in detail based on the following figures, wherein.

DESCRIPTION OF THE PREFERRED EMBODIMENTS

A description will now be given of embodiments of the present invention with reference to the accompanying drawings.

Figure 1A:
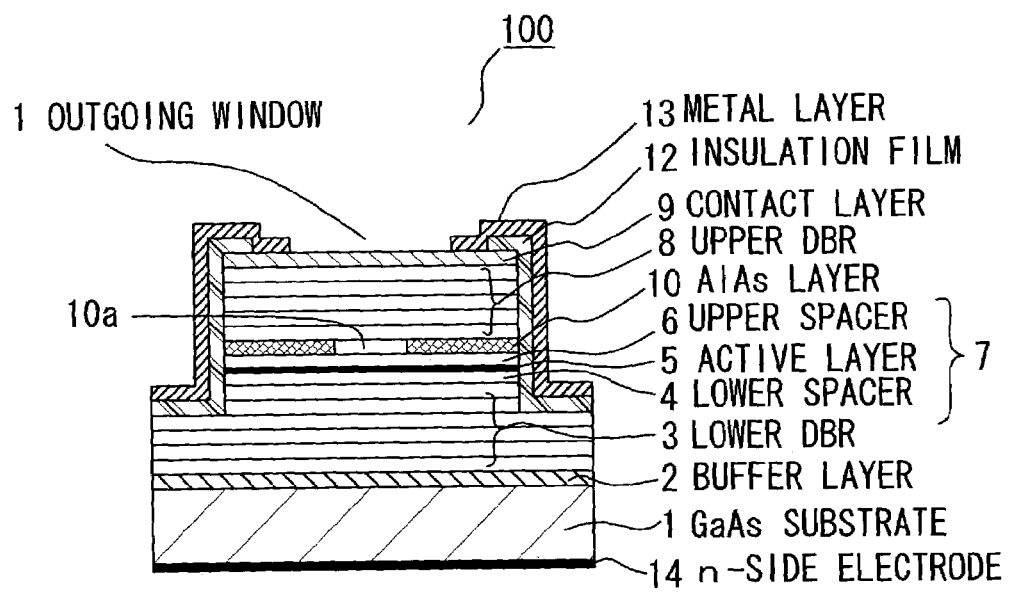
FIG. 1A is a cross-sectional view of a surface emitting semiconductor laser according to an embodiment of the present invention, wherein the cross-section is taken along a line X—X shown in FIG. 1B.
Figure 1B:
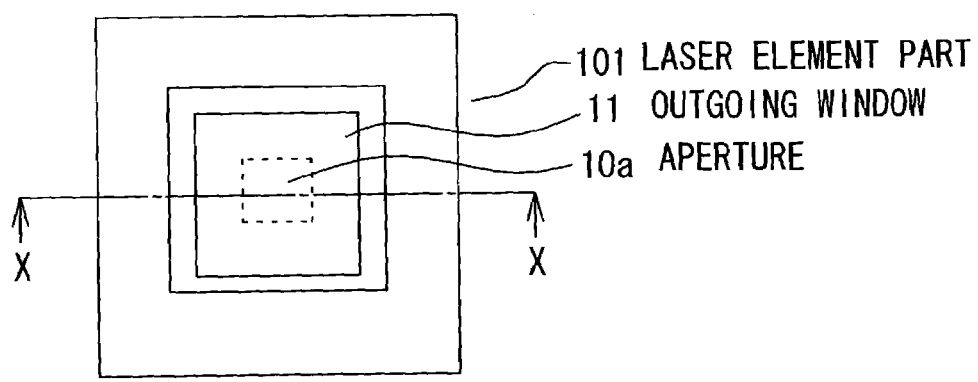
FIG. 1B is a plan view of the surface emitting semiconductor laser shown in FIG. 1A.

FIG. 1A is a cross-sectional view of a surface emitting semiconductor laser according to a first embodiment of the present invention, and FIG. 1B is a plan view thereof. The present embodiment is a selective oxidization type surface emitting semiconductor laser 100 equipped with a laser portion 101 having a rectangular mesa structure (post structure or pillar structure). A protection film that covers the laser portion (mesa) 101 and a bonding portion that extends from a metal contact layer are omitted from illustration for the sake of simplicity. Although the mesa or post employed in the present embodiment has a rectangular cross section, it may have a circular cross section.

The laser 101 has an n-type GaAs substrate 1, on which an n-type buffer layer 2 is provided. An n-type lower DBR (Distributed Bragg Reflector) 3 is provided on the buffer layer 2. On the lower DBR 3, laminated are an undoped lower spacer layer 4, an undoped quantum well active layer 5, and an undoped upper spacer layer 6 in this order. An active region 7 is formed so as to include the layers 4, 5 and 6. A p-type upper DBR 8 and a p-type contact layer 9 are laminated on the active region 7 in this order. The lowermost layer of the upper DBR 8 is a p-type AlAs layer 10, which serves as a current confinement layer equipped with a rectangular aperture 10a surrounded by an oxidized region.

A laser outgoing window 11 is formed in the center of the laser portion 10, and has a rectangular shape. The center of the current confinement layer 10 coincides with the center of the aperture 10a, and coincides with an optical axis extending on the centerline of the mesa 101 in the vertical direction from the substrate 1. An interlayer insulation film 12 covers the side surface and bottom of the mesa 101. A metal layer 13 is formed on the interlayer insulation film 12. The metal layer 13 is isolated from the mesa by the interlayer insulation film 12, and is electrically connected to the contact layer 9 on the top portion of the laser portion 101. The metal layer 13 serves as a p-side electrode. A backside electrode 14 is provided on the back surface of the substrate 1.

The lower DBR 3 is a multiple laminate of n-type $Al_{0.9}Ga_{0.1}As$ layers and $Al_{0.3}Ga_{0.7}As$ layers, each of which has a thickness $\lambda/4n_r$, where $\lambda$ is the oscillation wavelength and $n_r$ is the refractive index of the medium. The paired layers having different composition ratios are alternately laminated to a thickness of 40.5 periods. The carrier concentration of the lower DBR 3 is $3\times10^{18}$ cm$^{-3}$ after silicon that is an n-type impurity is doped.

In the active region 7, the lower spacer layer 4 is an undoped $Al_{0.6}Ga_{0.4}As$ layer. The quantum well active layer 5 includes an undoped $Al_{0.11}Ga_{0.89}As$ quantum well layer and an undoped $Al_{0.3}Ga_{0.7}As$ barrier layer. The upper spacer layer 6 is an undoped $Al_{0.6}Ga_{0.4}As$ layer.

The upper DBR 8 is a multiple laminate of p-type $Al_{0.9}Ga_{0.1}As$ layer and p-type $Al_{0.3}Ga_{0.7}As$ layers, each having a thickness $\lambda/4n_r$, where $\lambda$ is the oscillation wavelength and $n_r$ is the refractive index of the medium. The paired layers having different composition ratios are alternately laminated to a thickness of 30 periods. The carrier concentration of the upper DBR 8 is $3\times10^{18}$ cm$^{-3}$ after carbon that is a p-type impurity is doped.

The p-type contact layer 9 is a GaAs layer and is 20 nm thick. The carrier concentration of the p-type contact layer 9 is $1\times10^{20}$ cm$^{-3}$ after carbon that is a p-type impurity is doped. The metal layer 13, which serves as the p-side electrode, is a laminate of Ti/Au.

Although not shown in FIGS. 1A and 1B, in order to reduce the series resistance of the laser portion, practically, an intermediate (graded) layer having an intermediate mixed crystal ratio of GaAs/AlAs between the p-type $Al_{0.9}Ga_{0.1}As$ layer and the p-type $Al_{0.3}Ga_{0.7}As$ layer may be provided on the upper DBR 8 or below the lower DBR 3.

Figure 2A:
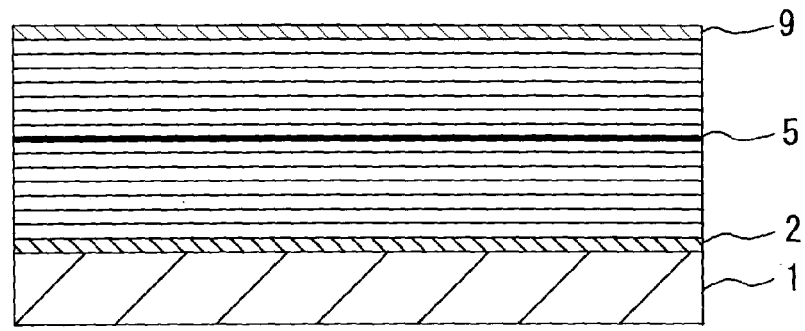
FIGS. 2A, 2B and 2C are cross-sectional views showing steps of a method of fabricating the semiconductor laser shown in FIGS. 1A and 1B.

A description will now be given of a method of fabricating the surface emitting semiconductor laser shown in FIGS. 1A and 1B. As shown in FIG. 2A, the buffer layer 2, the lower DBR 3, the active region 7, the AlAs layer 10, the DBR 8 and the contact layer 9 are laminated on the substrate 1 in turn.

Figure 2B:
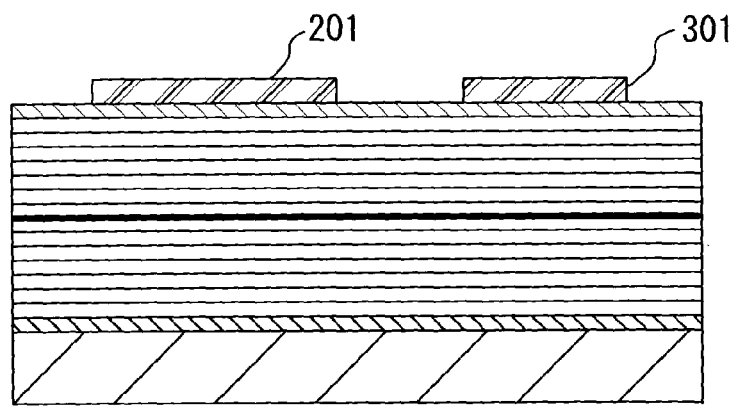

As shown in FIG. 2B, patterned silicon oxide layers 201 and 202 are provided on the contact layer 9. The silicon oxide layers 201 and 301 serve as mask layers for defining mesas on the substrate 1.

Figure 2C:
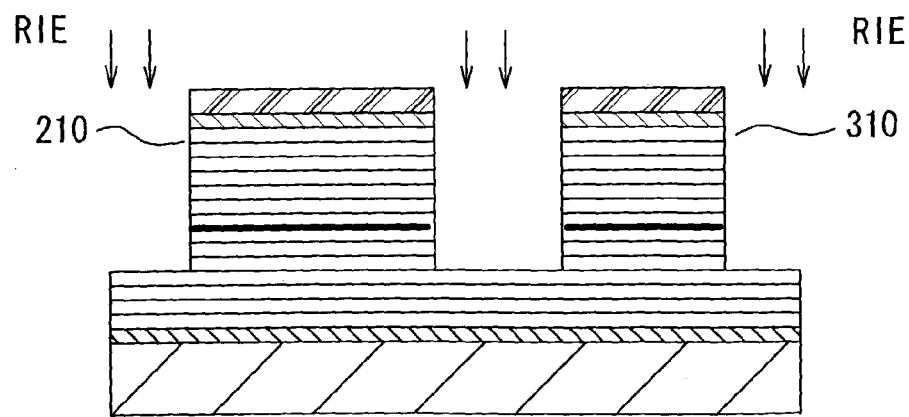

As shown in FIG. 2C, the contact layer 9, the upper DBR 8, the active region 7 and part of the lower DBR 3 are anisotropically etched by reactive ion etching (RIE) using a mixed gas of boron trichloride and chlorine ($BCl_3$ and $Cl_2$). This etching results in the mesa 210 of the laser portion and a mesa 310 for monitoring. It is not necessary to cause etching to advance up to the lower DBR 3 but to expose at least the side surface of the AlAs layer 10. For example, etching of up to the active layer 5 of the active region 7 may be accepted.

The mesa 210 of the laser portion is like a square pillar or parallelepiped, and has a planer shape of square. Preferably, the monitor-use mesa 310 has a rectangular parallelepiped, and has a planer shape of a long rectangle. The long sides of the mesa 310 (perpendicular to the drawing sheet) are longer than the short sides thereof. The short-side length of the mesa 310 is shorter than one side of the square mesa 210, and the long-side length thereof is longer than one side thereof.

Then, the AlAs layer 10 is selectively oxidized. This oxidization uses wet oxidization in which a water vapor obtained by bubbling pure water heated to 95° C. is transported to a wet oxidization chamber with nitrogen being used as carrier gas. The substrate is put in the oxidization chamber in advance and the in-chamber temperature is set at approximately 340° C. The AlAs layers included in the mesas 210 and 310 are oxidized from the side surfaces thereof.

In order to control the oxidization reaction on the AlAs layers, the oxidized condition of the AlAs layer of the monitor-use mesa 310 is monitored and is used to control the non-oxidized portion of the AlAs layer of the laser-use mesa 210, namely, the aperture size.

In AlAs (or AlGaAs), $AlO_x$ is formed in an oxidized portion, which becomes insulation, and has a reflection ratio (reflectance) different from that of AlAs. For instance, the average reflectance in the wavelength range of 800–1000 nm is 0.45 for AlAs and is 0.58 for $AlO_x$. Thus, by measuring the average reflectance of the AlAs layer in progress of oxidization, it is possible to track the degree of progress of oxidization reaction on the AlAs layer.

Taking into consideration the above, light in the wavelength range of 400 nm–1100 nm is projected onto a region of the monitor-use mesa 310 including the AlAs layer 311 (substantially, the surface of the mesa 310). Then, reflected light is sensed by a photoelectric element such as a photodiode or phototransistor and is then monitored. In this manner, the oxidized condition on the AlAs layer in progress can be known.

Figure 4:
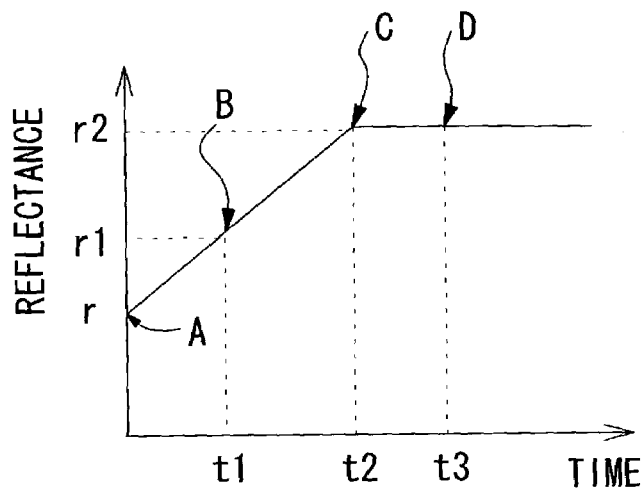
FIG. 4 is a graph of a reflectance vs. oxidization time characteristic of an AlAs layer.
Figure 5:
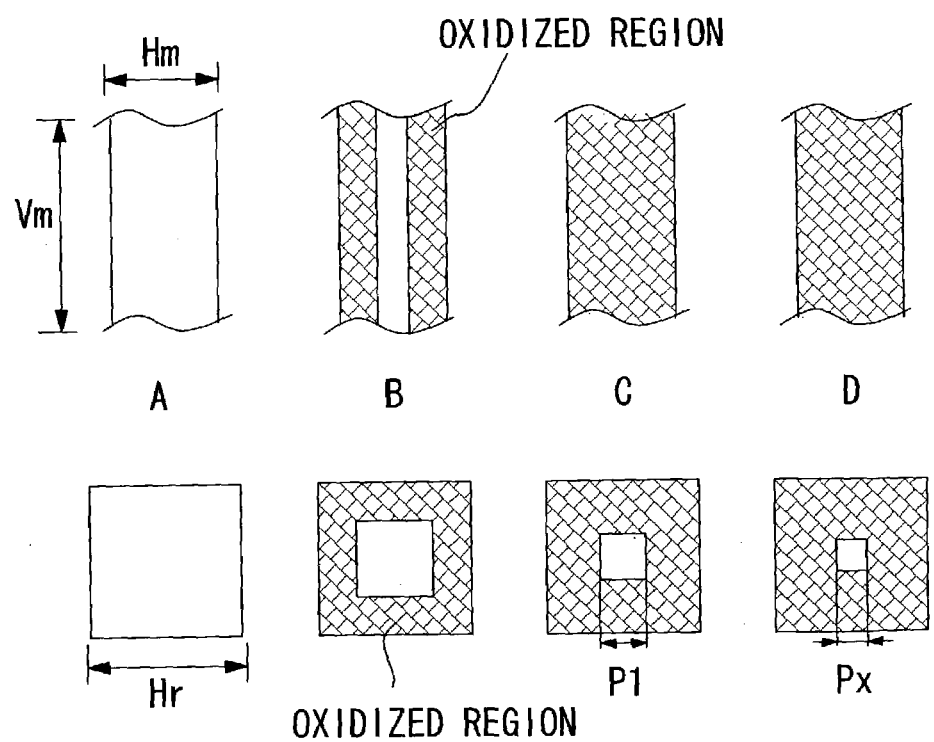
FIG. 5 illustrates a relation between oxidized conditions of an AlAs layer in a mesa for monitoring and those of an AlAs layer in a laser portion.

FIG. 4 is a graph of variation in the average reflectance of the AlAs layer 311 of the monitor-use mesa 310, and FIG. 5 shows a relation between the oxidized condition of the AlAs layer 311 of the monitor-use mesa 310 and the oxidized condition of the AlAs layer of the mesa 210 of the laser portion. The AlAs layer of the mesa 210 has an approximately square planer pattern (the region that is to be oxidized), and a side of a length Hr. The planer pattern of the AlAs layer 311 of the monitor-use mesa 310 has length Hm along the short-length side and Vm along the long-length side, wherein a condition such that Hm<Hr and Hm<<Vm stands.

At an oxidization starting time A, oxidization of the AlAs layers of the mesas 210 and 310 has not yet been started. At that time, the average reflectance obtained from the monitor-use mesa 310 has a given value r. When time t1 elapses, that is, at time B, oxidization has evenly advanced inwards from the side surface of the AlAs layer of the mesa 210. This oxidization defines a square aperture that is a non-oxidized region located in the center of the mesa 210. In contrast, the monitor-use mesa 310 has the long side Vm that is much longer than the short side Hm, so that it can be assumed that oxidization of the AlAs layer 311 virtually advances inward from the opposing long sides Vm thereof. The average reflectance of the AlAs layer 311 at that time is r1, which is higher than the average reflectance r obtained at time A.

When oxidization time 2 elapses, namely, at time C, the AlAs layer 311 of the mesa 310 is totally oxidized, and the average reflectance at this time is r2, which is higher than r1. In contrast, since the width Hr of the mesa 210 of the laser portion is greater than Hm, a non-oxidized region serving as an aperture PI remains in the mesa 210.

According to the present embodiment of the invention, in order to form aperture Px approximately equal to the designed size in the mesa 210, the oxidization process is terminated at time t3 after a given constant time from time C when oxidization of the AlAs layer 311 of the monitor-use mesa 310 is completed.

When the AlAs layer 311 of the mesa 310 is totally oxidized, the average reflectance r2 thereof becomes constant. In other words, variation in the average reflectance of the completely oxidized AlAs layer 311 is zero. In order to verify that the average reflectance is zero at time C, it is necessary to obtain the average reflectance at a time after time t2. When it is attempted to terminate the oxidization process at time t2, oxidization of the AlAs layer advances by such a delay. It is therefore difficult to obtain the aperture Px as designed.

Taking into consideration the above, a relation between time C and a corresponding aperture P1 is selected beforehand, and the process time necessary to detect zero-settlement of variation in the average reflectance is considered. The oxidization process is terminated after the period of time (t3-t2) longer than the process time elapses, so that the aperture Px can be obtained as designed. It is to be noted that the oxidization rate is proportional to the oxidization temperature. If the oxidization temperature is too high, it will be difficult to define the aperture Px by control of the period (t3-t2). It is therefore required to select an appropriate oxidization rate.

In the present embodiment, one side of the aperture Px is 3 μm long at time D, and one side of the aperture P1 just before time D1 is 4 μm long. In order to cause oxidization to advance from the aperture P1 to the aperture Px, the oxidization distance is equal to 0.5 μm (oxidization advances form both sides and an oxidization distance of 0.5 μm is assumed with the difference between Px and P1 being equal to 1 μm). It is therefore necessary to realize 0.5 μm oxidization during the period from time C to time D.

Figure 6:
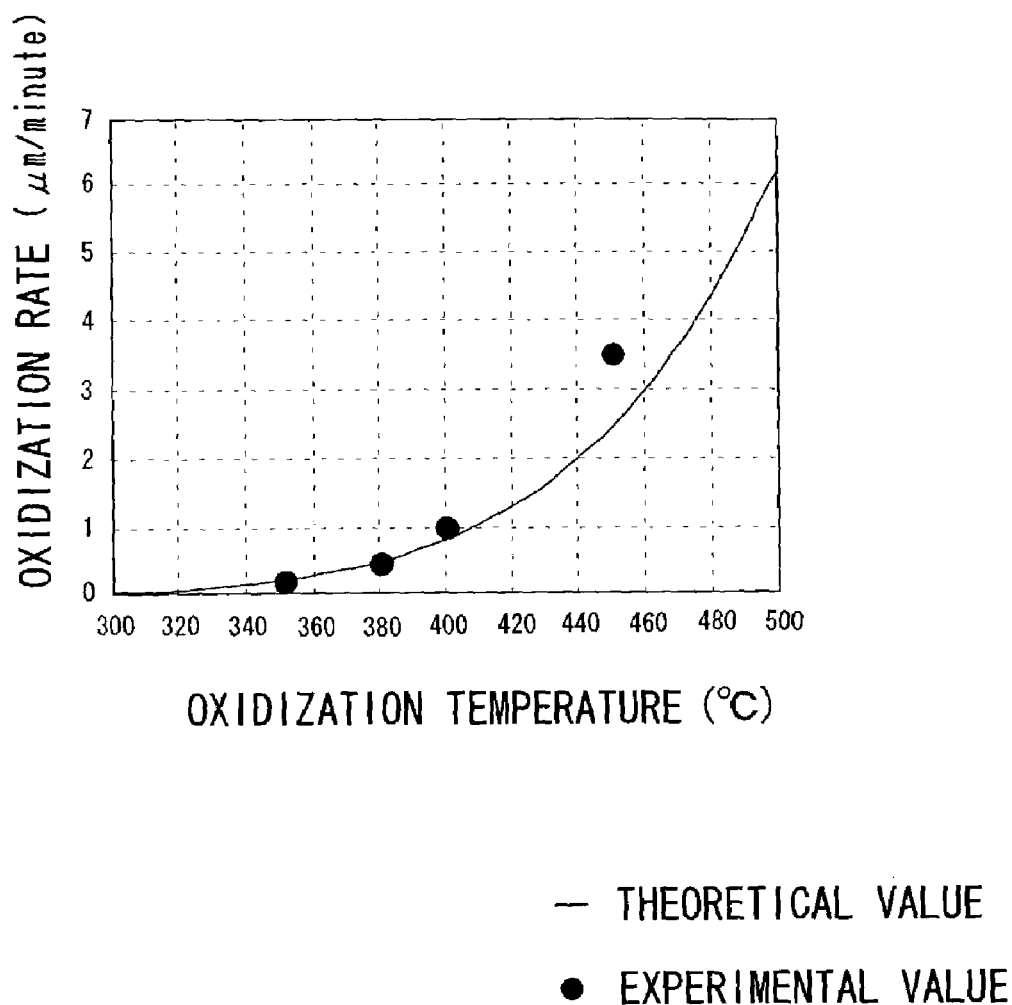
FIG. 6 is a graph of an oxidization rate vs. oxidization temperature characteristic of an AlAs layer.

FIG. 6 is a graph showing the relation between oxidization rate and oxidization temperature for AlAs (see Bikash Koley et al., "Kinetics of growth of AlAs oxide in selectively oxidized vertical cavity surface emitting lasers, Journal Applied Physics, 82,4586, 1997). As shown in FIG. 6, an oxidization rate of 0.5 μm/min is observed at an oxidization temperature of 380° C., and the period (t3-t2) is thus equal to about 1 minute. In practice, it is very difficult to regulate the oxidization within such a short period because of the time necessary to detect variation in the average reflectance at time C. Alternatively, it is possible to add an allowance to the period (t3-t2) by narrowing the width Hm of the pattern of the AlAs layer 311 of the monitor-use mesa 310. However, this may degrade the accuracy of control of the aperture Px. With the above in mind, the oxidization temperature is set lower than 380° C., preferably, lower than 375° C.

The following may be used as means for detecting variation in the reflectance at time C. For example, the reflectance is primary-differentiated with respect to time to thus obtain the variation ratio. It is also possible to perform secondary differentiation to thus obtain the extreme value. Besides, time C may be identified by extrapolation. This is as follows. An increasing (or decreasing) section of the reflectance is expressed by a straight line. A cross point where the straight line crosses a portion extending from the end point (variation in the reflectance is ceased or reduced) is obtained and set as the new end point.

Figure 3A:
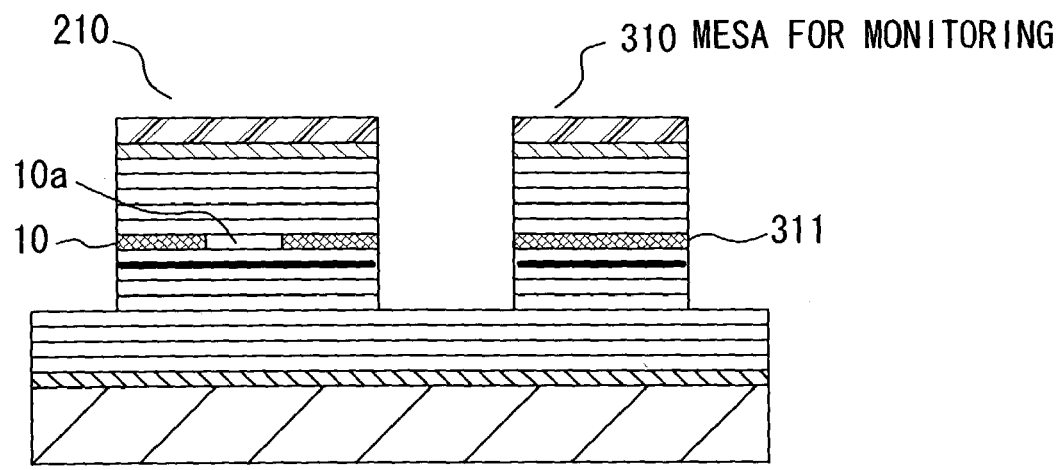
FIGS. 3A and 3B are cross-sectional views showing steps of the method, which steps follow those shown in FIGS. 2A–2C.
Figure 3B:
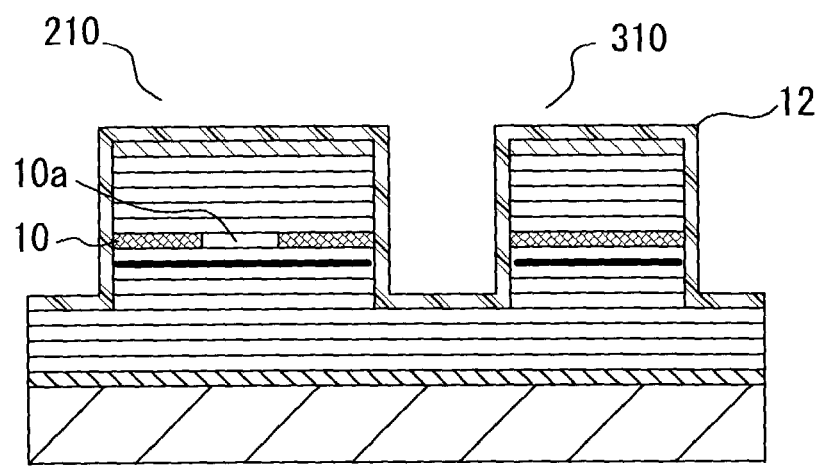

By the oxidization control mentioned above, as shown in FIG. 3A, part of the AlAs layer of the mesa 210 is selectively oxidized, so that the current confinement layer 10 having the aperture in the center thereof can be formed.

Referring to FIG. 3A again, the silicon oxide layers 201 and 301 used as the etching masks are removed, and the interlayer insulation film 12 is provided so as to cover the mesa 210. It is not necessarily required to apply the process that follows the step of forming the interlayer insulation film 12 to the monitor-use mesa 310.

Then, an outgoing window 11 is formed in the interlayer insulation film 12 on the top of the mesa, and the metal layer 13 connected to the contact layer 9 is formed. The metal layer 13 serves as the p-side electrode. Then, the n-side backside electrode 14 is formed on the back surface of the substrate 1.

Various monitor methods other than the mesa 310 for monitoring the oxidized condition may be used.

In the foregoing, the mesa 310 has the rectangular planer pattern of the AlAs layer 311. However, the mesa 310 is not limited to that shape, but may have a circular, oval, ellipse, or polygonal planer shape.

It is possible to use multiple mesas on the substrate, each being configured as the mesa 310. For instance, it is possible to use stripe-like patterns repeatedly arranged, each having a rectangular pattern like that of the AlAs layer 311. By checking lights reflected by the multiple patterns or mesas, it is possible to monitor the oxidized condition more accurately and reliably.

The monitor-use mesa 310 may be omitted. For example, light is projected onto the mesa surface of the laser portion in progress, and the oxidized condition on the AlAs layer is directly monitored. Using the oxidized condition thus monitored, the oxidization reaction on the AlAs layer is controlled.

The mesas 210 and 310 are not limited to the square and rectangular shapes but may have cylindrical shapes. The current confinement (optical confinement) layer 10 is not limited to the AlAs layer but may be made of III-V semiconductors containing Al such as AlGaAs.

The upper DBR 8 and the lower DBR 3 are respectively of p and n types, but may be of n and p types. In a case where the outgoing light is extracted from the backside of the substrate 1, the number of the upper DBR 8 is set larger than that of the lower DBR 3 so that the upper DBR 8 has a higher reflectance.

The quantum well active layer is not limited to GaAs/AlGaAs-based semiconductors but may be made of, for example, GaAs/InGaAs-based semiconductors or GaAs/GaInNAs-based semiconductors. The emission wavelength of light emitted from the quantum well layer is transparent to the GaAs substrate 1. This allows the outgoing light to be taken from the backside of the substrate 1 and brings about a process merit. In the foregoing, the contact layer 9 and the upper DBR 8 are handled as functionally separate layers. However, the contact layer 9 is part of the upper DBR 8.

Figure 7:
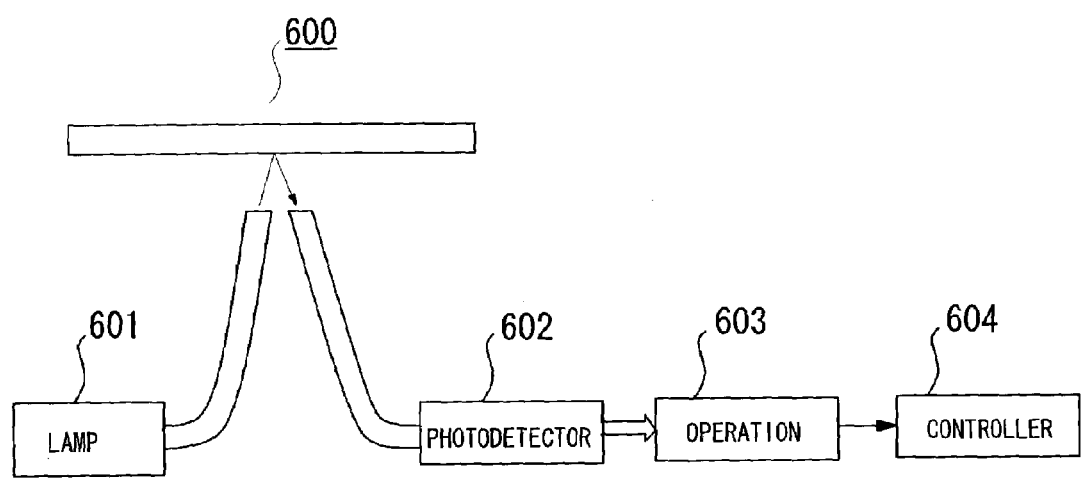
FIG. 7 is a block diagram of an apparatus for fabricating a surface emitting semiconductor laser according to an embodiment of the present invention.

FIG. 7 is a block diagram of an apparatus for fabricating the surface emitting semiconductor laser. An apparatus 600 fabricates the surface emitting semiconductor laser 100 having the current confinement region obtained by selectively oxidizing part of a III-V semiconductor layer containing Al, the apparatus. The apparatus 600 is configured as follows. A lamp 601, which serves as a projection part, projects light onto at least the III-V semiconductor layer (10 or 311) for oxidization. A photodetector 602, which serves as a photoelectric conversion part, converts reflected light from the III-V semiconductor layer into an electrical signal. An operation part 603 detects an oxidized condition on the III-V semiconductor layer on the basis of the electrical signal and outputs a signal when advance of oxidization goes beyond a given oxidized region. A controller 604, which serves as an oxidization control part, terminates oxidization of the III-V semiconductor layer when a given constant time elapses after receiving the signal output by the operation part.

Finally, the description given before is summarized below.

According to an aspect of the present invention, the method of fabricating a surface emitting semiconductor laser includes the steps of: forming a first laminate of semiconductor layers and a second laminate of semiconductor layers on a substrate, the first laminate including a first reflection mirror layer of a first conduction type, an active region, a III-V semiconductor layer containing Al, and a second reflection mirror layer of a second conduction type, the second laminate being used for monitoring and having an oxidizable region; etching the first and second laminates so as to form mesas on the substrate in which side surface of the III-V semiconductor layer contained in the first laminate is exposed; starting oxidization of the III-V semiconductor layer from the side surface at an oxidization rate S; and monitoring a reflectance of the second laminate for monitoring or its variation and terminating oxidization of the III-V semiconductor layer after a constant time T from a time when the reflectance or its variation reaches a corresponding given value. Thus, the distance of oxidization that advances inwards from the side surface of the first laminate can be controlled by the oxidization rate S and time T. This enables reliable and accurate reproduction of the aperture in the current confinement layer.

Preferably, assuming that an aperture that is an non-oxidized region of the III-V semiconductor layer of the first laminate is denoted as D when the reflectance or its variation of the second laminate for monitoring reaches the corresponding given value and is also denoted as D1 when oxidization is ended, the constant time T is determined based on the difference between the D and D1 and the oxidization rate S. The constant time T starts from the time when the reflectance of the second laminate or its variation reaches the corresponding given value, and is determined based on the above-mentioned difference. It is thus possible to form the aperture (D1) accurately.

Preferably, the oxidization rate is determined based on the oxidization temperature of the III-V semiconductor layer.

For example, when the III-V semiconductor layer is an AlAs layer, it is preferable to oxidize the AlAs layer at a temperature equal to or lower than 375° C. Oxidization advances at a relatively high rate over 375° C. This may make it difficult to control the constant time T based on the reflectance of the second laminate for monitoring or its variation.

For a temperature equal to or lower than 375° C., the oxidization rate S is 0.5 μm/min or lower, so that the time control for ending the oxidization reaction can be controlled easily. When the aperture (D1) of the non-oxidized region of the AlAs layer is approximately 3 μm long, oxidization at 375° C. or lower is very effective. Preferably, the aperture has a circular shape. However, the aperture may have any shape such as an oval, ellipse, rectangular, or polygonal shape. The shape of the aperture depends on the shape of the mesa shape (post shape) of the laser portion. The III-V semiconductor layer containing Al may be an AlGaAs layer.

Preferably, the second laminate for monitoring includes a second mesa simultaneously formed when the mesa is formed, and the second mesa including a second III-V semiconductor layer containing Al and having an exposed side surface. Thus, the first and second mesas have an identical layer structure, so that the same oxidization takes place in the first and second mesas. It is therefore possible to reliably control oxidization of the III-V semiconductor layer containing Al by monitoring the reflectance of the second laminate for monitoring.

The second laminate for monitoring may include multiple second mesas, each of which includes a second III-V semiconductor layer containing Al and having an exposed side surface. This monitors the reflectance of the second laminate or its variation more accurately.

Preferably, a second oxidizable region of the second III-V semiconductor layer in the first laminate may be smaller than the region of the III-V semiconductor layer included in the first laminate. Thus, oxidization can be stopped when the given time elapses after the starting time when the second region in the second laminate for monitoring is totally oxidized, in other words, when variation in the reflectance becomes equal to zero. The above oxidization control results in the very accurate aperture in the III-V semiconductor layer of the laser portion. It is easy to reliably detect the starting time when variation in the reflectance becomes equal to zero. Thus, there is no great error in detection of the starting time, so that the current confining layer the aperture can be produced with high dimensional accuracy.

According to another aspect of the present invention, the method of fabricating a surface emitting semiconductor laser includes the steps of: forming first and second mesas respectively including III-V semiconductor layers containing Al, side surfaces of the III-V semiconductor layers being exposed; optically monitoring an oxidized condition of the III-V semiconductor layer of the first mesa while the first and second mesas are exposed to an oxidization ambient set at a temperature lower than a predetermined temperature; and forming a current confinement region by controlling the oxidized region of the III-V semiconductor layer of the second mesa on the basis of results of optical monitoring. Thus, the first and second mesas are subject to the common process environment, and oxidization thereof depends on common environment factors. It is therefore possible to accurately form the aperture of the current confinement region.

The first and second mesas may be simultaneously formed on the substrate so as to have an identical composition, and the III-V semiconductor layer of the first mesa has an oxidizable region, which is smaller than that of the III-V semiconductor layer of the second mesa. The identical composition means that the first and second mesas have the same layers, so that the firs and second mesas are placed under the same condition for oxidization. By using the comparative small oxidizable region of the first mesa, it is possible to cease oxidization of the first mesa when a situation that the second mesa is totally oxidized is detected. For example, it is possible to detect, from the reflectance of the first mesa, completion of oxidization of the oxidizable region of the Al-contained III-V semiconductor layer of first mesa and to terminate of the Al-contained III-V semiconductor layer of the second mesa when the given constant time elapses from the detection. Preferably, the given constant time may be set longer than a process time necessary to detect the situation. The process time may be obtained by differentiating the reflectance with respect to time in order to obtain variation in the reflectance.

According to a further aspect of the present invention, the method of fabricating a surface emitting semiconductor laser includes the steps of: forming a laminate of a first reflection mirror layer of a first conduction type, an active region thereon, a III-V semiconductor layer containing Al, and a second reflection mirror of a second conduction time on the active region; etching predetermined layers that form the laminate so that a side surface of the III-V semiconductor layer can be exposed; oxidizing the III-V semiconductor layer at a temperature equal to or lower than 375° C.; monitoring reflectance of the III-V semiconductor layer or its variation; and terminating oxidization of the III-V semiconductor layer when a given constant time elapses after the reflection or its variation reaches a corresponding given value. Thus, oxidization advances at a comparatively low rate, so that the oxidization distance from the side surface of the mesa can accurately be controlled with ease. It is therefore possible to reliably reproduce the aperture in the current confinement layer with high dimensional accuracy.

The III-V semiconductor layer may be oxidized at a temperature equal to or higher than about 300° C. For example, oxidization advances very slowly at a temperature lower than 300° C. for AlAs. An oxidization temperature below 300° C. is not practical.

According to a still further aspect of the present of the present invention, the apparatus for fabricating a surface emitting semiconductor laser having a current confinement region obtained by selectively oxidizing part of a III-V semiconductor layer containing Al, includes: a projection part that projects light onto at least the III-V semiconductor layer for oxidization; a photoelectric conversion part that converts reflected light from the III-V semiconductor layer into an electrical signal; an operation part that detects an oxidized condition on the III-V semiconductor layer on the basis of the electrical signal and outputs a signal when advance of oxidization goes beyond a given oxidized region; and an oxidization control part that terminates oxidization of the III-V semiconductor layer when a given constant time elapses after receiving the signal output by the operation part.

The above-mentioned apparatus can control the oxidization distance from the side surface of the mesa by monitoring the oxidized condition of the Al-contained III-V semiconductor layer. It is therefore possible to accurately form the oxidized region in the III-V semiconductor layer and to stabilize device performance and improve the production yield.

Preferably, the apparatus may further include a display part that displays the oxidized condition by using the signal output by the operation part. The operator may visually recognize the oxidized condition via the display part and stop oxidizing.

According to another aspect of the present invention, the surface emitting semiconductor laser includes: a substrate; and a laminate on the substrate, the laminate including a first reflection layer of a first conduction type, an active region on the first reflection layer, a current confinement layer including an oxidized region, and a second reflection layer on the current confinement layer, a mesa including a range from the second reflection layer to the current confinement layer, the oxidized region of the current confinement layer extending inwards from a side surface of the mesa, and has been oxidized at a temperature equal to or lower than 375° C. The aperture thus formed substantially has dimensions as designed. The current confinement layer may be an AlAs layer or an AlGaAs layer.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of fabricating a surface emitting semiconductor laser comprising the steps of:
    forming a first laminate of semiconductor layers and a second laminate of semiconductor layers on a substrate, the first laminate including a first reflection mirror layer of a first conduction type, an active region, a III-V semiconductor layer containing Al, and a second reflection mirror layer of a second conduction type, the second laminate being used for monitoring and having an oxidizable region;
    etching the first laminate so as to form a mesa on the substrate in which a side surface of the III-V semiconductor layer contained in the first laminate is exposed;
    starting oxidization of the III-V semiconductor layer from the side surface at an oxidization rate; and
    monitoring a reflectance of the second laminate for monitoring or its variation and terminating oxidization of the III-V semiconductor layer after a constant time from a time when the reflectance or its variation reaches a corresponding given value.

2. The method as claimed in claim 1, wherein assuming that an aperture that is an non-oxidized region of the III-V semiconductor layer of the first laminate is denoted as D when the reflectance or its variation of the second laminate for monitoring reaches the corresponding given value and is also denoted as D1 when oxidization is terminated, the constant time is determined based on the difference between the D and D1 and the oxidization rate.

3. The method as claimed in claim 1, wherein the oxidization rate is determined based on the oxidization temperature of the III-V semiconductor layer.

4. The method as claimed in claim 1, wherein the III-V semiconductor layer is an AlAs layer, which is oxidized at a temperature equal to or lower than 375° C.

5. The method as claimed in claim 4, wherein the aperture of the non-oxidized region in the AlAs layer has a circular shape and a diameter of approximately 3 µm.

6. The method as claimed in claim 1, wherein the III-V semiconductor layer is an AlGaAs layer.

7. The method as claimed in claim 1, wherein the second laminate for monitoring includes a second mesa simultaneously formed when the mesa is formed, and the second mesa including a second III-V semiconductor layer containing Al and having an exposed side surface.

8. The method as claimed in claim 1, wherein the second laminate for monitoring includes multiple second mesas, each of which includes a second III-V semiconductor layer containing Al and having an exposed side surface.

9. The method as claimed in claim 7, wherein a second oxidizable region of the second III-V semiconductor layer in the second laminate is smaller than the region of the III-V semiconductor layer included in the first laminate.

10. A method of fabricating a surface emitting semiconductor laser comprising the steps of:
    forming first and second mesas respectively including III-V semiconductor layers containing Al, side surfaces of the III-V semiconductor layers being exposed;
    optically monitoring an oxidized condition of the III-V semiconductor layer of the first mesa while the first and second mesas are exposed to an oxidization ambient set at a temperature lower than a predetermined temperature;
    forming a current confinement region by controlling the oxidized region of the III-V semiconductor layer of the second mesa on the basis of results of optical monitoring;
    detecting a situation in which the oxidizable region of the III-V semiconductor layer of the first mesa is totally oxidized from a reflectance of the first mesa; and
    terminating oxidization of the III-V semiconductor layer of the second mesa when a given constant time elapses after the situation is detected.

11. The method as claimed in claim 10, wherein:
    the first and second mesa are simultaneously formed on the substrate so as to have an identical composition; and
    the III-V semiconductor layer of the first mesa has an oxidizable region, which is smaller than another that of the III-V semiconductor layer of the second mesa.

12. The method as claimed in claim 10, wherein the given constant time is longer than a process time necessary to detect the situation.

13. The method as claimed in claim 12, wherein a step of detecting the situation comprises the step of differentiating the reflectance with respect to time in order to obtain variation in the reflectance.

14. The method as claimed in claim 10, wherein the predetermined temperature is equal to or lower than about 375° C.

15. A method of fabricating a surface emitting semiconductor laser comprising the steps of:
    forming a laminate of a first reflection mirror layer of a first conduction type, an active region thereon, a III-V semiconductor layer containing Al, and a second reflection mirror of a second conduction time on the active region;
    etching predetermined layers that form the laminate so that a side surface of the III-V semiconductor layer can be exposed;
    oxidizing the III-V semiconductor layer at a temperature equal to or lower than 375° C.;
    monitoring reflectance of the III-V semiconductor layer or its variation; and
    terminating oxidization of the III-V semiconductor layer when a given constant time elapses after the reflection or its variation reaches a corresponding given value.

16. The method as claimed in claim 15, wherein the III-V semiconductor layer is oxidized at a temperature equal to or higher than about 300° C.

17. The method as claimed in claim 15, wherein the III-V semiconductor layer is one of an AlAs layer and an AlGaAs layer.

18. An apparatus for fabricating a surface emitting semiconductor laser having a current confinement region obtained by selectively oxidizing part of a III-V semiconductor layer containing Al, the apparatus comprising:

a projection part that projects light onto at least the III-V semiconductor layer for oxidization;

a photoelectric conversion part that converts reflected light from the III-V semiconductor layer into an electrical signal;

an operation part that detects an oxidized condition on the III-V semiconductor layer on the basis of the electrical signal and outputs a signal when advance of oxidization goes beyond a given oxidized region; and an oxidization control part that terminates oxidization of the III-V semiconductor layer when a given constant time elapses after receiving the signal output by the operation part.

19. The apparatus as claimed in claim 18, further comprising a display part that displays the oxidized condition by using the signal output by the operation part.

* * * * *